(12) United States Patent
Kim et al.

(10) Patent No.: US 12,038,481 B2
(45) Date of Patent: Jul. 16, 2024

(54) VOLTAGE SENSING CIRCUIT, BATTERY PACK, AND BATTERY SYSTEM

(71) Applicant: LG ENERGY SOLUTION, LTD., Seoul (KR)

(72) Inventors: Hong-Kyun Kim, Daejeon (KR); Je-Chang Ryu, Daejeon (KR); Jong-Kwang Shin, Daejeon (KR); Ik-Jae Lee, Daejeon (KR); Chang-Hun Sung, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 170 days.

(21) Appl. No.: 17/765,630

(22) PCT Filed: Apr. 13, 2021

(86) PCT No.: PCT/KR2021/004678
§ 371 (c)(1),
(2) Date: Mar. 31, 2022

(87) PCT Pub. No.: WO2021/210904
PCT Pub. Date: Oct. 21, 2021

(65) Prior Publication Data
US 2022/0365141 A1  Nov. 17, 2022

(30) Foreign Application Priority Data
Apr. 16, 2020 (KR) .......................... 10-2020-0046094

(51) Int. Cl.
*G01R 31/36* (2020.01)
*G01R 31/3835* (2019.01)
*H01M 10/48* (2006.01)

(52) U.S. Cl.
CPC ..... *G01R 31/3646* (2019.01); *G01R 31/3835* (2019.01); *H01M 10/488* (2013.01)

(58) Field of Classification Search
None
See application file for complete search history.

(56) References Cited

U.S. PATENT DOCUMENTS 6,236,216 B1  5/2001  Shimoyama et al.
11,251,651 B2 *  2/2022  Lee .......................... G09F 13/22
(Continued)

FOREIGN PATENT DOCUMENTS

JP    57-170067 U    10/1982
JP    09129272 A  *  5/1997  ............. Y02E 60/10
(Continued)

OTHER PUBLICATIONS

English Translation of JP 09-129272 A (Year: 1997).*
(Continued)

*Primary Examiner* — Jermele M Hollington
(74) *Attorney, Agent, or Firm* — Birch, Stewart, Kolasch & Birch, LLP

(57) ABSTRACT

Provided are a voltage sensing circuit, including a first sub-sensing circuit including a light emitting device, and electrically connected in parallel to a battery, and a second sub-sensing circuit including a light receiving device optically coupled to the light emitting device, and electrically isolated from the first sub-sensing circuit. The light emitting device is for generating an optical signal in response to a voltage across the light emitting device. The second sub-sensing circuit is for outputting a voltage sensing signal indicating a level of voltage across the battery in response to the optical signal. When the voltage across the battery is equal to a first reference voltage indicating an overvoltage state of the battery, a second reference voltage which is lower than the first reference voltage is applied across the light emitting device. The second reference voltage is lower than a threshold voltage of the light emitting device.

10 Claims, 6 Drawing Sheets

(56) References Cited

U.S. PATENT DOCUMENTS

2005/0092899 A1    5/2005   Wolf et al.
2013/0033793 A1    2/2013   Takeda
2014/0145685 A1    5/2014   Bosch et al.

FOREIGN PATENT DOCUMENTS

| | | | |
|---|---|---|---|
| JP | 10-312829 A | 11/1998 | |
| KR | 10-312829 A | 11/1996 | |
| KR | 10-1999-003849 A | 1/1999 | |
| KR | 10-0778670 B1 | 11/2007 | |
| KR | 2008-199261 A | 6/2008 | |
| KR | 20100090198 A * | 8/2010 | .......... H02J 7/00302 |
| KR | 2011-22148 A | 2/2011 | |
| KR | 10-1253229 B1 | 4/2013 | |
| KR | 10-1457986 B1 | 11/2014 | |
| KR | 10-2016-0071207 A | 6/2016 | |
| KR | 10-2016-0088097 A | 7/2018 | |
| KR | 10-2018-0136807 A | 12/2018 | |

OTHER PUBLICATIONS

English Translation of KR20100090198A (Year: 2010).*
International Search Report (PCT/ISA/210) issued in PCT/KR2021/004678, dated Jul. 19, 2021.
Extended European Search Report for European Application No. 21788441.0, dated Jan. 9, 2023.

* cited by examiner

VOLTAGE SENSING CIRCUIT, BATTERY PACK, AND BATTERY SYSTEM

TECHNICAL FIELD

The present disclosure relates to technology for sensing battery voltage.

The present application claims the benefit of Korean Patent Application No. 10-2020-0046094 filed on Apr. 16, 2020 with the Korean Intellectual Property Office, the disclosure of which is incorporated herein by reference in its entirety.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

To use the battery safely and efficiently over the long term, it is necessary to accurately sense the voltage of the battery. The voltage across the battery is sensed by electrically connecting a pair of input pins of a single type of voltage sensing circuit such as AD8452 to a positive electrode terminal and a negative electrode terminal of the battery respectively. However, in case that a failure occurs in the voltage sensing circuit or a component connected to the voltage sensing circuit, it is difficult to appropriately sense the voltage of the battery.

DISCLOSURE

Technical Problem

The present disclosure is designed to solve the above-described problem, and therefore the present disclosure is directed to providing a voltage sensing circuit for detecting a voltage across a battery alone or in conjunction with another voltage sensing circuit and a battery pack comprising the voltage sensing circuit.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A voltage sensing circuit for a battery according to an aspect of the present disclosure includes a first sub-sensing circuit including a light emitting device, and electrically connected in parallel to the battery, and a second sub-sensing circuit including a light receiving device optically coupled to the light emitting device, and electrically isolated from the first sub-sensing circuit. The light emitting device is configured to generate an optical signal in response to a voltage applied across the light emitting device. The second sub-sensing circuit is configured to output a voltage sensing signal indicating a level of voltage across the battery in response to the optical signal. In response to the voltage across the battery being equal to a first reference voltage indicating an overvoltage state of the battery, a second reference voltage which is lower than the first reference voltage is applied across the light emitting device. The second reference voltage is lower than a threshold voltage of the light emitting device.

The light receiving device may include at least one of a photo register or a photo transistor.

A resistance of the light emitting device when the second reference voltage is applied across the light emitting device may be larger than a resistance of the light emitting device when the threshold voltage is applied across the light emitting device.

The first sub-sensing circuit may further include a diode string electrically connected in series to the light emitting device. The diode string includes at least one diode.

In response to the first reference voltage being applied across the first sub-sensing circuit, a third reference voltage which is lower than the first reference voltage may be applied across the diode string.

In response to the first reference voltage being applied across the first sub-sensing circuit, a first ratio between the second reference voltage and the resistance of the light emitting device may be equal to a second ratio between the third reference voltage and a resistance of the diode string.

In response to the first reference voltage being applied across the first sub-sensing circuit, a total parallel resistance between an equivalent resistance of a neighboring circuit electrically connected in parallel to the battery and a resistance of the first sub-sensing circuit may be equal to or larger than a predetermined ratio of the equivalent resistance.

The second sub-sensing circuit may further include a resistor electrically connected in series to the light receiving device, and an analog-digital converter to generate the voltage sensing signal from the voltage across the resistor.

A battery pack according to another aspect of the present disclosure includes the voltage sensing circuit.

A battery system according to still another aspect of the present disclosure includes the battery pack.

Advantageous Effects

The voltage sensing circuit according to at least one of the embodiments of the present disclosure includes the first sub-sensing circuit electrically connected in parallel to two terminals of the battery and the second sub-sensing circuit optically coupled to the first sub-sensing circuit, to indirectly detect the voltage across the battery alone or in combination with another voltage sensing circuit.

In addition, the voltage sensing circuit according to at least one of the embodiments of the present disclosure may sense the voltage of the battery using the voltage-current-resistance characteristics in the sub-threshold voltage range of the light emitting device included in the voltage sensing circuit. Accordingly, when the voltage of the battery is in a predetermined normal range, the resistance of the first sub-sensing circuit is equal to or larger than a predetermined resistance, thereby reducing the influence on the battery voltage sensing operation of another sensing circuit.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
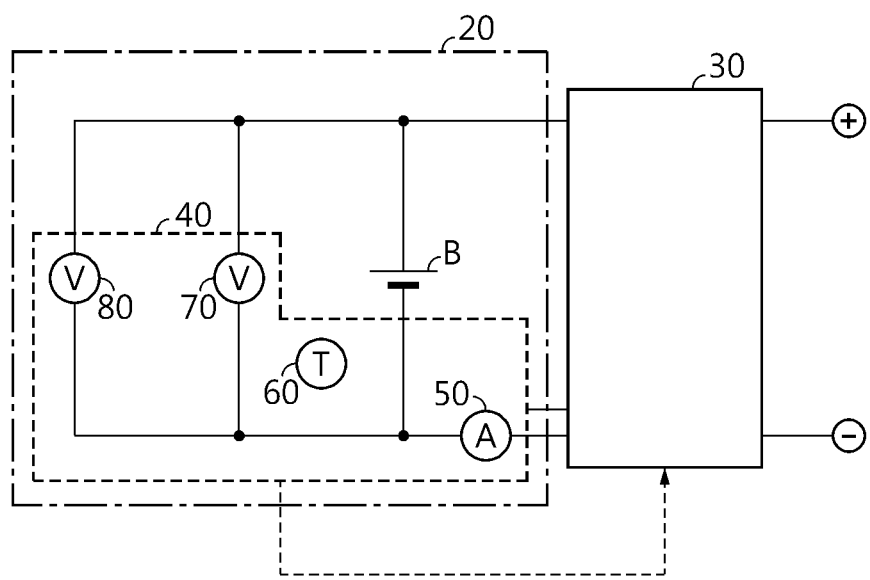
FIG. 1 is a diagram exemplarily showing a battery system according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements.

In addition, throughout the specification, it will be further understood that when an element is referred to as being "connected to" another element, it can be directly connected to the other element or intervening elements may be present.

FIG. 1 is a diagram exemplarily showing a battery system 10 according to an embodiment of the present disclosure.

Referring to FIG. 1, the battery system 10 includes a battery pack 20 and a charge/discharge control device 30. The battery system 10 refers to an electric device on which the battery pack 20 is mounted, such as, for example, an electric vehicle or an energy storage system.

The battery pack 20 includes a battery B and a sensing device 40. The battery B includes at least one rechargeable unit cell. When the battery B includes at least two unit cells, they are electrically connected in series or in parallel.

The sensing device 40 is provided to individually sense the current, temperature and voltage of the battery B. The sensing device 40 may include a current sensing circuit 50, a temperature sensing circuit 60 and a voltage sensing circuit 70.

The current sensing circuit 50 is provided to be electrically connected to a charge/discharge path of the battery B. The current sensing circuit 50 is configured to generate a signal indicating the magnitude and direction of the current flowing through the battery B. For example, a shunt resistor and/or a hall effect device may be used as the current sensing circuit 50.

The temperature sensing circuit 60 is positioned within a predetermined distance from the battery B and configured to generate a signal indicating the temperature of the battery B. For example, a negative temperature coefficient (NTC) thermistor may be used as the temperature sensing circuit 60.

The voltage sensing circuit 70 is electrically connected in parallel to the battery B through the positive electrode terminal and the negative electrode terminal of the battery B. The voltage sensing circuit 70 is configured to a signal indicating the voltage (hereinafter referred to as 'voltage of the battery') across the battery B. The detailed configuration of the voltage sensing circuit 70 will be described with reference to FIG. 2 as below.

The sensing device 40 may further include an additional voltage sensing circuit 80. In the same way as the voltage sensing circuit 70, the voltage sensing circuit 80 is electrically connected in parallel to the battery B, and senses the voltage of the battery B. The voltage sensing circuit 70 may be an analog front-end such as AD8452. When the sensing device 40 is provided with the voltage sensing circuit 70 and the voltage sensing circuit 80, the two voltage sensing circuits 70, 80 are complementary to each other.

The sensing device 40 transmits a sensing signal of each of the sensed current, temperature and voltage of the battery B to the charge/discharge control device 30. The charge/discharge control device 30 is provided to control the charge/discharge of the battery B based on the sensing signal from the sensing device 40. The charge/discharge control device 30 may include at least one of a controller, a relay, a DC-DC converter or a DC-AC converter. For example, when the sensing signal indicates an abnormal state (for example, overvoltage) of the battery B, the controller of the charge/discharge control device 30 may stop the charge/discharge of the battery B by turning off at least one of the relay, the DC-DC converter or the DC-AC converter.

Figure 2:
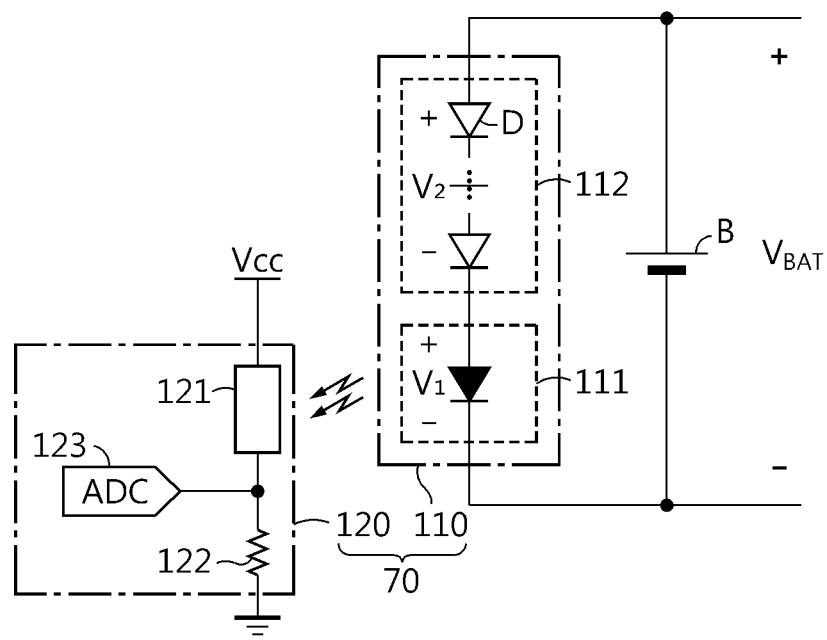
FIG. 2 is a diagram exemplarily showing a configuration of a voltage sensing circuit according to an embodiment of the present disclosure.

FIG. 2 is a diagram showing exemplarily the configuration of the voltage sensing circuit 70 according to an embodiment of the present disclosure. To help with understanding of the invention, FIG. 2 only shows the battery B and the voltage sensing circuit 70.

Referring to FIGS. 1 and 2, the voltage sensing circuit 70 includes a first sub-sensing circuit 110 and a second sub-sensing circuit 120.

The first sub-sensing circuit 110 is electrically connected in parallel to the battery B. The first sub-sensing circuit 110 includes a light emitting device 111. The light emitting device 111 refers collectively to any device that changes in the intensity of light emitted from the light emitting device 111 according to the level of voltage across the light emitting device 111, such as, for example, a Light Emitting Diode (LED). The light emitting device 111 is configured to generate an optical signal in response to the voltage applied across the light emitting device 111 by the battery B. The light intensity of the optical signal has a unique correspondence relationship with the forward voltage of the light emitting device 111.

The first sub-sensing circuit 110 further includes a diode string 112. In this case, the first sub-sensing circuit 110 may be said to be a series circuit of the light emitting device 111 and the diode string 112. The diode string 112 is electrically connected in series to the light emitting device 111. The diode string 112 includes a single diode D or at least two diodes D electrically connected in series. The light emitting device 111 and each diode D are electrically connected in a direction in which the voltage of the battery B is applied in forward direction.

Assume that $V_{BAT}$ is the voltage of the battery B, $V_1$ is the voltage of the light emitting device 111, and $V_2$ is the voltage of the diode string 112. $V_{BAT} > V_1$, $V_{BAT} > V_2$, and it may be simplified as $V_{BAT} = V_1 + V_2$. Accordingly, when the voltage of the battery B is equal to a first reference voltage (for example, 4.2V) indicating an overvoltage state of the battery B, a second reference voltage (for example, 1.674V) which is lower than the first reference voltage is applied across the light emitting device 111, and a third reference voltage which is lower than the first reference voltage is applied across the diode string 112. The second reference voltage (see $V_{R2}$ of FIG. 3) is lower than a threshold voltage (see $V_{TH1}$ of FIG. 3) of the light emitting device 111. The threshold voltage of the light emitting device 111 indicates a forward voltage drop of the light emitting device 111 when a predetermined level of electric current in forward direction flows through the light emitting device 111. A voltage range that is equal to or more than the threshold voltage of the light emitting device 111 may be referred to as a 'main threshold voltage range', and a voltage range that is less than the threshold voltage of the light emitting device 111 may be referred to as a 'sub-threshold voltage range'. The sub-threshold voltage range is a range using a micro current (for example, on the level of a few micro ampere), so low power is feasible.

The second sub-sensing circuit 120 is configured to output a voltage sensing signal indicating the level of voltage across the battery B in response to the optical signal from the first sub-sensing circuit 110.

The second sub-sensing circuit 120 includes a light receiving device 121. The light receiving device 121 is optically coupled to the light emitting device 111. The light receiving device 121 refers collectively to any device that changes in its resistance by the intensity of light transmitted to the light receiving device 121. For example, a photo register and a photo transistor may be used as the light receiving device 121.

The second sub-sensing circuit 120 may further include a resistor 122 and an analog-digital converter 123. The resistor 122 is electrically connected in series to the light receiving device 121 between a voltage source $V_{CC}$ and the ground. The resistor 122 has a unique resistance. A series circuit of the light receiving device 121 and the resistor 122 may act as a voltage divider to divide the constant voltage from the voltage source $V_{CC}$.

A signal input pin of the analog-digital converter 123 is electrically connected to a connecting node between the light receiving device 121 and the resistor 122. The analog-digital converter 123 converts the voltage across the resistor 122 as an analog input into a digital output as the voltage sensing signal. As described above, the light intensity of the optical signal emitted by the light emitting device 111 changes depending on the voltage of the light emitting device 111, and the light receiving device 121 changes in its resistance in response to the intensity of light transmitted to the light receiving device 121. Since the analog input changes depending on the resistance of the light receiving device 121, the digital output indicates the level of voltage of the battery B.

Figure 3:
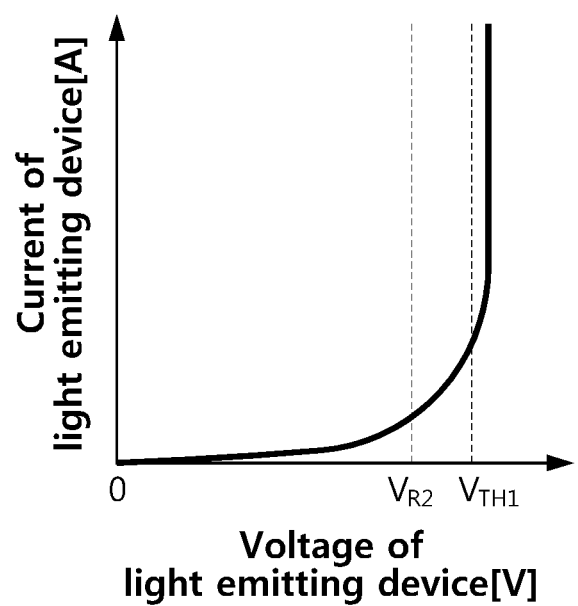
FIG. 3 is a graph showing exemplarily voltage-current relationship characteristics of a light emitting device of FIG. 2.
Figure 4:
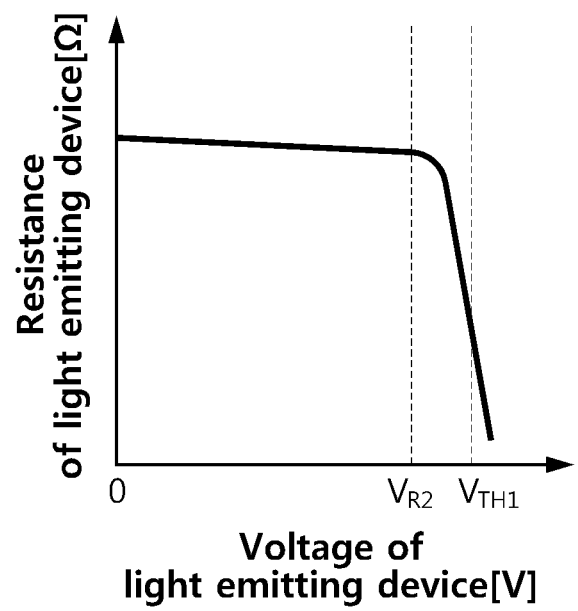
FIG. 4 is a graph showing exemplarily voltage-resistance relationship characteristics of a light emitting device of FIG. 2.

FIG. 3 is a graph showing exemplarily voltage-current relationship characteristics of the light emitting device 111 of FIG. 2, and FIG. 4 is a graph showing exemplarily voltage-resistance relationship characteristics of the light emitting device 111 of FIG. 2.

Referring to FIGS. 2 to 4, it can be seen that the current of the light emitting device 111 increases very rapidly from the moment when the voltage $V_1$ of the light emitting device 111 exceeds the threshold voltage $V_{TH1}$. Additionally, the resistance of the light emitting device 111 decreases very rapidly from the moment when the voltage $V_1$ of the light emitting device 111 exceeds the threshold voltage $V_{TH1}$.

The resistance of the light emitting device 111 when the second reference voltage $V_{R2}$ is applied across the light emitting device 111 may be larger than the resistance of the light emitting device 111 when the threshold voltage $V_{TH1}$ is applied across the light emitting device 111.

Figure 5:
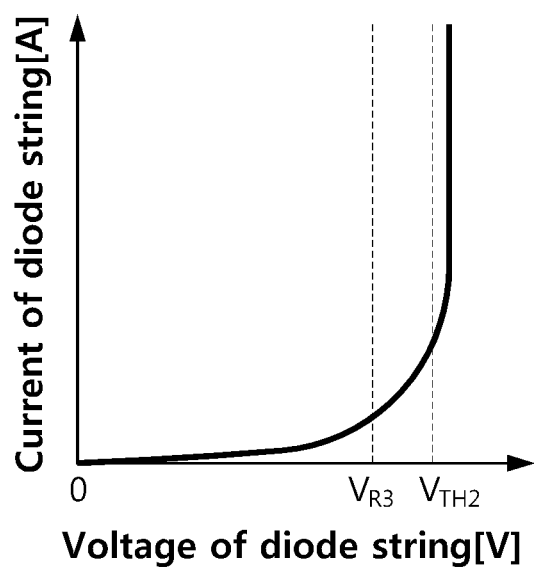
FIG. 5 is a graph showing exemplarily voltage-current relationship characteristics of a diode string of FIG. 2.
Figure 6:
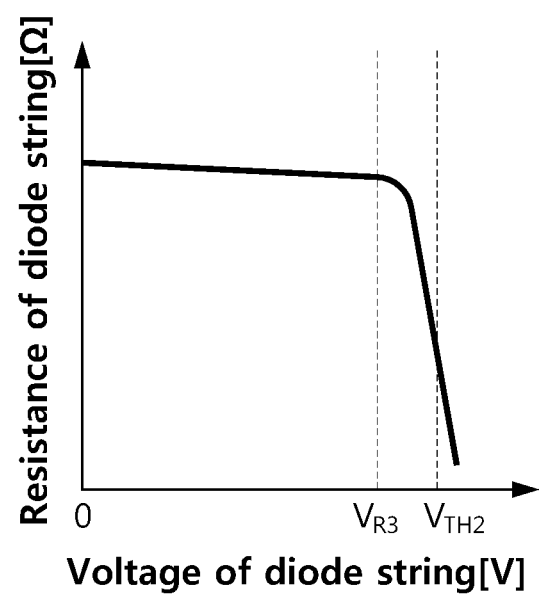
FIG. 6 is a graph showing exemplarily voltage-resistance relationship characteristics of a diode string of FIG. 2.

FIG. 5 is a graph showing exemplarily voltage-current relationship characteristics of the diode string 112 of FIG. 2, and FIG. 6 is a graph showing exemplarily voltage-resistance relationship characteristics of the diode string 112 of FIG. 2.

Referring to FIGS. 2, 5 and 6, it can be seen that the current of the diode string 112 increases very rapidly from the moment when the voltage $V_2$ of the diode string 112 exceeds the threshold voltage $V_{TH2}$. Additionally, the resistance of the diode string 112 decreases very rapidly from the moment when the voltage $V_1$ of the diode string 112 exceeds the threshold voltage $V_{TH2}$. The threshold voltage $V_{TH2}$ of the diode string 112 indicates a forward voltage drop of the diode string 112 when a predetermined level of electric current in forward direction flows through the diode string 112.

The resistance of the diode string 112 when the third reference voltage $V_{R3}$ is applied across the diode string 112 may be larger than the resistance of the diode string 112 when the threshold voltage $V_{TH2}$ of the diode string 112 is applied across the diode string 112.

When the voltage of the battery B is equal to or lower than the first reference voltage, the forward current flowing through the light emitting device 111 and the forward current flowing through the diode string 112 are equal. For example, when the first reference voltage is applied across the first sub-sensing circuit 110, a first ratio between the second reference voltage and the resistance of the light emitting device 111 is equal to a second ratio between the third reference voltage and the resistance of the diode string 112.

Meanwhile, when the voltage sensing circuit 80 as the neighboring circuit is electrically connected in parallel to the battery B, an error may occur in the voltage sensing circuit 80 due to the voltage-current-resistance characteristics of the voltage sensing circuit 70. The reason is because the voltage sensing circuit 80 has a unique equivalent resistance, and the resistance of the first sub-sensing circuit 110 changes depending on the voltage of the battery B. Referring to FIGS. 4 and 6, it can be seen that as the voltage of the light emitting device 111 increases, the resistance of the light emitting device 111 decreases, and as the voltage of the diode string 112 increases, the resistance of the diode string 112 decreases.

Assume that the voltage of the battery B is equal to or lower than the first reference voltage. The resistance of the light emitting device 111 may be minimum when the voltage of the light emitting device 111 is the second reference voltage, and the resistance of the diode string 112 may be minimum when the voltage of the diode string 112 is the third reference voltage. Accordingly, the resistance of the first sub-sensing circuit 110 which is the sum of the resistance of the light emitting device 111 and the resistance of the diode string 112 may be minimum when the voltage of the battery B is the first reference voltage.

According to the principle of a parallel combination of resistors, as the resistance of the first sub-sensing circuit 110 is smaller, the influence on the equivalent resistance of the neighboring circuit is greater. Accordingly, it is necessary to make the total parallel resistance between the equivalent resistance of the neighboring circuit and the resistance of the first sub-sensing circuit 110 to be equal to or larger than a predetermined ratio (for example, 98%) of the equivalent resistance of the neighboring circuit when the resistance of the first sub-sensing circuit 110 is minimized. Here, the predetermined ratio is for ensuring the accuracy of the voltage sensing result by the voltage sensing circuit 80, and may be preset based on the voltage sensing offset of the voltage sensing circuit 80.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A voltage sensing circuit for a battery, comprising:
a first sub-sensing circuit including a light emitting device, and electrically connected in parallel to the battery; and
a second sub-sensing circuit including a light receiving device optically coupled to the light emitting device, and electrically isolated from the first sub-sensing circuit,
wherein:
the light emitting device is configured to generate an optical signal in response to a voltage applied across the light emitting device,
the second sub-sensing circuit is configured to output a voltage sensing signal indicating a level of voltage across the battery in response to the optical signal,
in response to the voltage across the battery being equal to a first reference voltage indicating an overvoltage state of the battery, a second reference voltage which is lower than the first reference voltage is applied across the light emitting device,
the second reference voltage is lower than a threshold voltage of the light emitting device, and
a resistance of the light emitting device when the second reference voltage is applied across the light emitting device is larger than a resistance of the light emitting device when the threshold voltage is applied across the light emitting device.

2. A voltage sensing circuit for a battery, comprising:
a first sub-sensing circuit including a light emitting device, and electrically connected in parallel to the battery; and
a second sub-sensing circuit including a light receiving device optically coupled to the light emitting device, and electrically isolated from the first sub-sensing circuit,
wherein:
the light emitting device is configured to generate an optical signal in response to a voltage applied across the light emitting device,
the second sub-sensing circuit is configured to output a voltage sensing signal indicating a level of voltage across the battery in response to the optical signal,
in response to the voltage across the battery being equal to a first reference voltage indicating an overvoltage state of the battery, a second reference voltage which is lower than the first reference voltage is applied across the light emitting device, and
the second reference voltage is lower than a threshold voltage of the light emitting device.

3. The voltage sensing circuit according to claim 2, wherein the light receiving device includes at least one of a photo register or a photo transistor.

4. The voltage sensing circuit according to claim 2, wherein the first sub-sensing circuit further includes a diode string electrically connected in series to the light emitting device, and
wherein the diode string includes at least one diode.

5. The voltage sensing circuit according to claim 4, wherein in response to the first reference voltage being applied across the first sub-sensing circuit, a third reference voltage which is lower than the first reference voltage is applied across the diode string.

6. The voltage sensing circuit according to claim 5, wherein in response to the first reference voltage being applied across the first sub-sensing circuit, a first ratio between the second reference voltage and the resistance of the light emitting device is equal to a second ratio between the third reference voltage and a resistance of the diode string.

7. The voltage sensing circuit according to claim 5, wherein in response to the first reference voltage being applied across the first sub-sensing circuit, a total parallel resistance between an equivalent resistance of a neighboring circuit electrically connected in parallel to the battery and a resistance of the first sub-sensing circuit is equal to or larger than a predetermined ratio of the equivalent resistance.

8. The voltage sensing circuit according to claim 2, wherein the second sub-sensing circuit further includes:

a resistor electrically connected in series to the light receiving device; and an analog-digital converter configured to generate the voltage sensing signal from a voltage across the resistor.

9. A battery pack comprising the voltage sensing circuit according to claim 2.

10. A battery system comprising the battery pack according to claim 9.

\* \* \* \* \*